(12) United States Patent
Hong

(10) Patent No.: US 8,026,752 B2
(45) Date of Patent: Sep. 27, 2011

(54) DELAY CIRCUIT

(75) Inventor: Yun Seok Hong, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 18 days.

(21) Appl. No.: 12/494,451

(22) Filed: Jun. 30, 2009

(65) Prior Publication Data

US 2010/0156490 A1   Jun. 24, 2010

(30) Foreign Application Priority Data

Dec. 24, 2008 (KR) .................. 10-2008-0132793

(51) Int. Cl.
*H03K 3/289* (2006.01)

(52) U.S. Cl. ........ 327/202; 327/147; 327/156; 327/161; 327/200; 327/201

(58) Field of Classification Search .................. 327/161, 327/202

See application file for complete search history.

(56) References Cited

U.S. PATENT DOCUMENTS

| 5,465,076 | A | 11/1995 | Yamauchi et al. |
|---|---|---|---|
| 6,836,165 | B2 | 12/2004 | Goto et al. |
| 6,982,923 | B2 | 1/2006 | Ootsuki |
| 2005/0254307 | A1 | 11/2005 | Dietrich et al. |
| 2009/0039936 | A1* | 2/2009 | Kim .............................. 327/202 |

FOREIGN PATENT DOCUMENTS

| JP | 02-159815 A | 6/1990 |
|---|---|---|
| JP | 2003-273712 A | 9/2003 |
| JP | 2005-348296 A | 12/2005 |

\* cited by examiner

*Primary Examiner* — Lincoln Donovan
*Assistant Examiner* — John Poos
(74) *Attorney, Agent, or Firm* — Ladas & Parry LLP

(57) ABSTRACT

Disclosed is a delay circuit. The delay circuit includes a pulse generating unit, a timing adjusting unit, and a pulse width adjusting unit. The pulse generating unit is configured to generate a pulse signal having a preset width in response to a rising edge of an input signal. The timing adjusting unit is configured to activate an output signal in response to the pulse signal after a predetermined time has lapsed. The pulse width adjusting unit is configured to adjust a pulse width of the output signal in response to the activation of the output signal.

13 Claims, 2 Drawing Sheets

DELAY CIRCUIT

CROSS-REFERENCES TO RELATED APPLICATION

The present application claims priority under 35 U.S.C. 119(a) to Korean application number 10-2008-0132793, filed on Dec. 24, 2008, in the Korean Patent Office, which is incorporated by reference in its entirety as if set forth in full.

BACKGROUND OF THE INVENTION

1. Technical Field

The present invention relates generally to a semiconductor circuit, and more particularly, to a delay circuit for use in a semiconductor circuit.

2. Related Art

Conventionally a delay circuit can be realized in several ways. For example, the delay circuit can be realized by arranging unit delays in the form of an array, with an inverter is used as the unit delay.

The delay circuit according to the conventional art allows a signal to be sequentially delayed through a plurality of unit delays, thereby delaying an input signal by a predetermined time.

However, the conventional delay circuit is problematic because the conventional delay circuit cannot delay an output signal by a predetermined time due to a variation of a width of the input signal, or may cause the output signal to have an irregular pulse width. Further, when the input signal has an excessively broad pulse width (for example, about several hundreds picoseconds), the output signal may not be generated.

SUMMARY

A delay circuit capable of stably generating an output signal having a uniform pulse width regardless of a pulse width of an input signal is described herein.

In one embodiment of the present invention the delay circuit includes a pulse generating unit configured to generate a pulse signal having a preset width in response to a rising edge of an input signal; a timing adjusting unit configured to activate an output signal in response to the pulse signal after a predetermined time has lapsed; and a pulse width adjusting unit configured to adjust a pulse width of the output signal in response to the activation of the output signal.

In another embodiment of the present invention the delay circuit includes a pulse generating unit configured to generate a pulse signal having a preset width in response to a rising edge of an input signal; a first switching device configured to output a power level in response to the pulse signal; a first delay device configured to activate an output signal by delaying an output of the first switching device during a first setting time, a second delay device configured to delay an output of the first delay device during a second setting time, and a second switching device configured to inactivate the output signal in response to an output of the second delay device.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
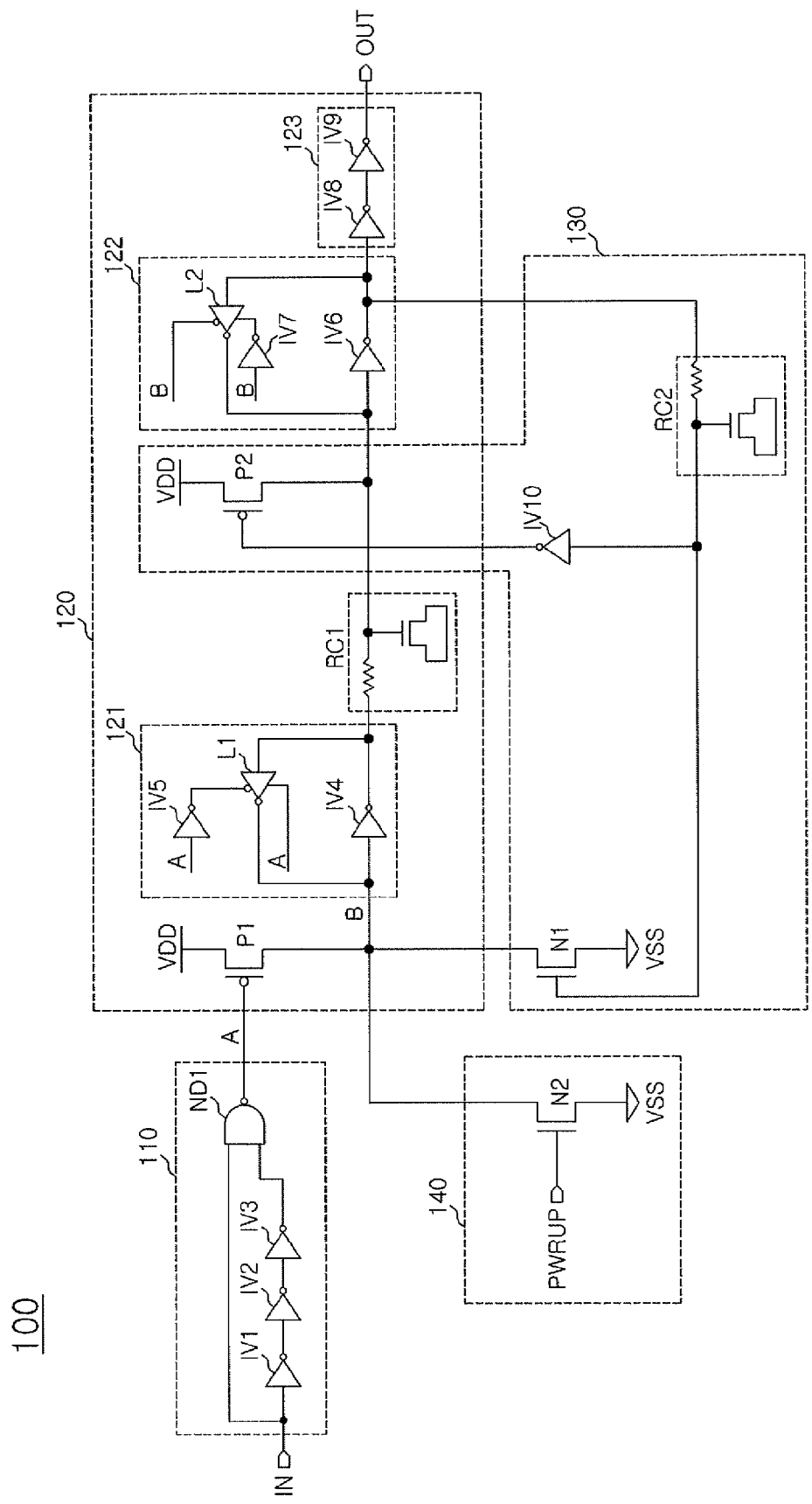
FIG. 1 is a schematic circuit diagram showing a delay circuit according to one embodiment.

Hereinafter, exemplary embodiments of the present invention will be described in detail. Accordingly, it is understood that the present invention is not limited to these particular exemplary embodiments disclosed below and that the present invention can be implemented in any number of various alternate forms which are too numerous to be discussed in detail. These present exemplary embodiments are provided for illustrative purposes to allow one skilled in the art to more easily grasp the essence of the present invention. FIG. 1 is a schematic circuit diagram showing a delay circuit according one embodiment of the present invention. As shown in FIG. 1, a delay circuit 100 includes a pulse generating unit 110, a timing adjusting unit 120, a pulse width adjusting unit 130, and an initialization unit 140.

The pulse generating unit 110 is configured to generate a pulse signal having a preset pulse width in response to a rising edge of an input signal 'IN'.

The pulse generating unit 110 includes a first inverter IV1, a second inverter IV2, a third inverter IV3, and a NAND gate ND1. It should be understood that the above configuration is by way of example, and the present invention is not limited to the number of inverters being equal to three.

The timing adjusting unit 120 is configured to activate an output signal 'OUT' in response to the pulse signal generated by the pulse generating unit 110 after a lapse of a predetermined time. Since the output signal 'OUT' is activated after the predetermined time has lapsed, the input signal 'IN' is delayed by the predetermined time.

The timing adjusting unit 120 includes a first transistor P1, a fourth inverter IV4, a fifth inverter IV5, a sixth inverter IV6, a seventh inverter IV7, an eighth inverter IV8, a ninth inverter IV9, a first tri-state inverter L1, a second tri-state inverter L2, and a first delay device RC1.

The amount of delay time of the input signal 'IN' is determined when designing the first delay device RC1. That is, the first delay device RC1 is designed in consideration of a target delay time.

A power terminal VDD is connected to a source of the first transistor P1, a first node A, that is, an output node of the pulse generating unit 110 is connected to a gate of the first transistor P1, and a second node B is connected to a drain of the first transistor P1.

A first latch 121 includes the fourth inverter IV4, the fifth inverter IV5 and the first tri-state inverter L1, and is connected between the second node B and an input terminal of the first delay device RC1.

A second latch 122 includes the sixth inverter IV6, the seventh inverter IV7 and the second tri-state inverter L2, and is connected between an output terminal of the first delay device RC1 and a buffer 123 that includes the eighth inverter IV8 and the ninth inverter IV9.

As shown in FIG. 1, the first node A is connected to an input terminal of the fifth inverter IV5 of the first latch 121, an output terminal of the fifth inverter IV5 is connected to a first control terminal of the first tri-state inverter L1, and the first node A is connected to a second control terminal of the first tri-state inverter L1.

As shown in FIG. 1, the second node B is connected to an input terminal of the seventh inverter IV7 of the second latch 122, the second node B is connected to a first control terminal of the second tri-state inverter L2, and an output terminal of the seventh inverter IV7 is connected to a second control terminal of the second tri-state inverter L2.

The pulse width adjusting unit 130 is configured to adjust a pulse width of the output signal 'OUT' in response to the activation of the output signal 'OUT'.

The pulse width adjusting unit 130 includes a second transistor P2, a third transistor N1, a second delay device RC2 and a tenth inverter IV10.

An input terminal of the second delay device RC2 is connected to an output terminal of the sixth inverter IV6.

An input terminal of the tenth inverter IV10 is connected to an output terminal of the second delay device RC2.

A power terminal VDD is connected to a source of the second transistor P2, a drain of the second transistor P2 is connected between the first delay device RC1 and an input terminal of the sixth inverter IV6, and an output terminal of the tenth inverter IV10 is connected to a gate of the second transistor P2.

A source of the third transistor N1 is connected to a ground terminal VSS, the output terminal of the second delay device RC2 is connected to a gate of the third transistor N1, and a drain of the third transistor N1 is connected to the second node B.

The initialization unit 140 is configured to initialize the output signal 'OUT' into a preset level, for example, a low level in response to a power-up signal 'PWRUP' applied thereto.

The initialization unit 140 includes a fourth transistor N2. A source of the fourth transistor N2 is connected to a ground terminal VSS, a gate of the fourth transistor N2 receives the power-up signal 'PWRUP', and a drain of the fourth transistor N2 is connected to the second node B.

Hereinafter, an operation of the delay circuit according to one embodiment of the present invention will be described.

The initialization unit 140 initializes the second node B into a low level in response to the activation of the power-up signal 'PWRUP'.

The pulse generating unit 110 detects the rising edge of the input signal 'IN' and outputs a pulse signal having a preset pulse width through the first node A in response to the rising edge of the input signal 'IN'. The preset pulse width of the pulse signal is determined by delay devices, that is, the first to third inverters IV1 to IV3.

The first transistor P1 is turned on in response to a low level pulse signal output through the first node A, so as to transition the is second node B to a high level.

While the low level pulse signal is being generated through the first node A, the first tri-state inverter L1 is turned off. The first tri-state inverter L1 is configured to maintain the level of the second node B. That is, the first tri-state inverter L1 is turned off in response to the low level pulse signal so as to prevent the tri-state inverter L1 from being unnecessarily operated when the first transistor P1 sets the second node B into a high level.

A high-level signal of the second node B is activated after a lapse of the preset delay time, which is set in the first delay device RC1, and then the high-level signal is output as the output signal 'OUT'. That is, after the rising edge of the input signal 'IN' is generated, when the delay time of the first delay device RC1 has lapsed, the output signal 'OUT' is activated. The signal delay by the fourth, sixth, eighth, and ninth inverters IV4, IV6, IV8, and IV9 can be disregarded because the signal delay negligible as compared with the signal delay by the delay device RC1.

The output signal 'OUT' is inactivated after a lapse of a preset delay time set in the second delay device RC2, so the pulse width of the output signal 'OUT' is fixed. That is, when the delay time of the second delay device RC2 has lapsed after the output signal 'OUT' is activated, the second transistor P2 and the third transistor N1 are turned on, thereby inactivating the output signal 'OUT'.

Figure 2:
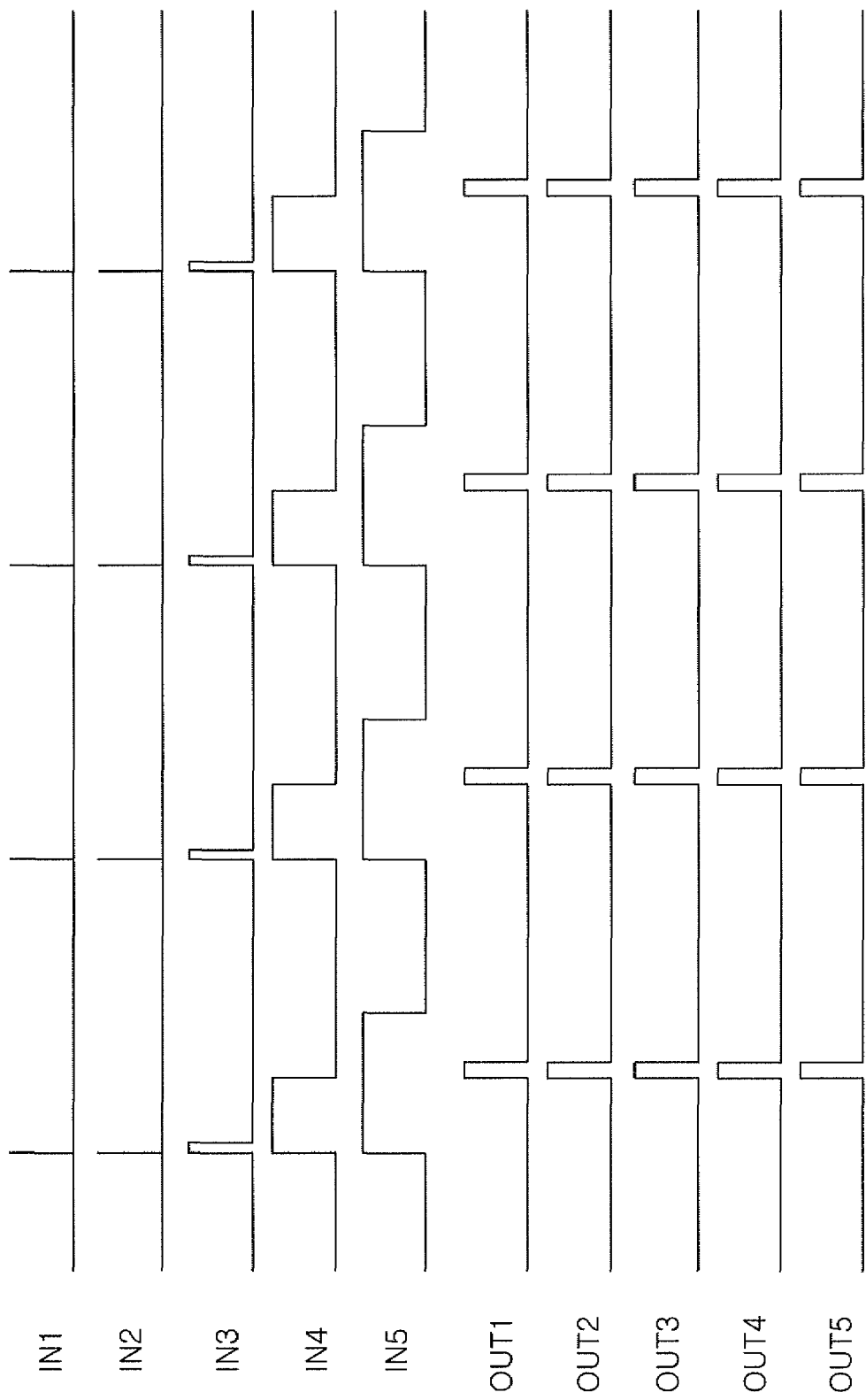
FIG. 2 is a view showing waveforms of input/output signals of the delay circuit of FIG. 1.

FIG. 2 is a view showing waveforms of input/output signals of the delay circuit of FIG. 1. FIG. 2 clearly shows that the present invention overcomes the problems associated with the conventional delay circuit, in which the input signal 'IN' is transferred through a unit delay. According to the delay circuit according to one embodiment of the present invention, the rising edge of the input signal 'IN' is detected, and subsequently the input signal 'IN' is delayed by a preset time so as to provide the output signal 'OUT' having a predetermined pulse width. Accordingly, as shown in FIG. 2, regardless of the pulse width of input signals 'IN1' to 'IN5', output signals 'OUT1' to 'OUT5' having a uniform pulse width can be provided.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A delay circuit comprising:
    a pulse generating unit configured to generate a pulse signal having a preset width in response to a rising edge of an input signal;
    a timing adjusting unit configured to activate an output signal in response to the pulse signal after a predetermined time has lapsed;
    a pulse width adjusting unit configured to adjust a pulse width of the output signal in response to the activation of the output signal; and
    an initialization unit configured to initialize the output signal in response to a control signal, wherein a power up signal is used as the control signal.

2. The delay circuit of claim 1, wherein the timing adjusting unit comprises:
    a first switching device configured to output a voltage in response to the pulse signal; and
    a first delay device configured to receive and delay an output of the first switching device so as to control an activation timing of the output signal.

3. The delay circuit of claim 2, wherein the timing adjusting unit further comprises:
    a first latch unit configured to latch the output of the first switching device; and
    a second latch unit configured to latch an output of the first delay device.

4. The delay circuit of claim 3, wherein the first latch unit is configured to operate in response to an output of the pulse generating unit.

5. The delay circuit of claim 4, wherein the second latch unit is configured to operate in response to the output of the first switching device.

6. The delay circuit of 2, wherein the pulse width adjusting unit comprises:

a second delay device configured to delay the output of the first delay device for a preset time; and a second switching device configured to inactivate the output signal in response to an output of the second delay device.

7. The delay circuit of claim 6, wherein the first delay device and the second delay device comprise a resistor and a capacitor.

8. The delay circuit of claim 1, wherein a width of the output signal is independent of a width of the input signal.

9. A delay circuit comprising:

a pulse generating unit configured to generate a pulse signal having a preset width in response to a rising edge of an input signal;

a first switching device configured to output a voltage in response to the pulse signal;

a first delay device configured to activate an output signal by delaying an output of the first switching device for a first setting time;

a second delay device configured to delay an output of the first delay device for a second setting time; and a second switching device configured to inactivate the output signal in response to an output of the second delay device, wherein each of the first delay device and the second delay device comprise a resistor and a capacitor.

10. The delay circuit of claim 9, further comprising:

a first latch unit configured to latch the output of the first switching device; and a second latch unit configured to latch the output of the first delay device.

11. The delay circuit of claim 10, wherein the first latch unit is configured to operate in response to an output of the pulse generating unit.

12. The delay circuit of claim 11, wherein the second latch unit is configured to operate in response to the output of the first switching device.

13. The delay circuit of claim 9, wherein a width of the output signal is independent of a width the input signal.

* * * * *